United States Patent
Koh et al.

(10) Patent No.: US 7,687,369 B2
(45) Date of Patent: Mar. 30, 2010

(54) METHOD OF FORMING FINE METAL PATTERNS FOR A SEMICONDUCTOR DEVICE USING A DAMASCENE PROCESS

(75) Inventors: Cha-won Koh, Yongin-si (KR);
Jeong-lim Nam, Yongin-si (KR);
Gi-sung Yeo, Seoul (KR); Sang-jin Kim, Suwon-si (KR); Sung-gon Jung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 160 days.

(21) Appl. No.: 11/896,512

(22) Filed: Sep. 4, 2007

(65) Prior Publication Data

US 2008/0200026 A1    Aug. 21, 2008

(30) Foreign Application Priority Data

Feb. 16, 2007    (KR) .................. 10-2007-0016797

(51) Int. Cl.
*H01L 21/76* (2006.01)
(52) U.S. Cl. ............................................. 438/421
(58) Field of Classification Search .................. None
See application file for complete search history.

(56) References Cited

U.S. PATENT DOCUMENTS

| | | | | |
|---|---|---|---|---|
| 5,891,799 | A * | 4/1999 | Tsui | ............... 438/624 |
| 6,239,008 | B1 | 5/2001 | Yu et al. | |
| 6,403,417 | B1 | 6/2002 | Chien et al. | |
| 6,790,770 | B2 * | 9/2004 | Chen et al. | ............... 438/637 |
| 7,202,174 | B1 | 4/2007 | Jung et al. | |
| 7,256,126 | B1 | 8/2007 | Chen | |
| 7,312,158 | B2 | 12/2007 | Miyagawa et al. | |
| 2003/0027420 | A1 | 2/2003 | Lai et al. | |
| 2003/0207584 | A1 | 11/2003 | Sivakumar et al. | |
| 2004/0017989 | A1 | 1/2004 | So | |
| 2005/0269702 | A1 * | 12/2005 | Otsuka | ............... 257/750 |
| 2006/0046484 | A1 | 3/2006 | Abatchev et al. | |
| 2006/0234166 | A1 | 10/2006 | Lee et al. | |
| 2006/0263699 | A1 | 11/2006 | Abatchev et al. | |
| 2007/0123037 | A1 | 5/2007 | Lee et al. | |
| 2008/0026541 | A1 * | 1/2008 | Edelstein et al. | ............ 438/421 |
| 2008/0048340 | A1 | 2/2008 | Lee et al. | |
| 2008/0131793 | A1 | 6/2008 | Lee et al. | |

FOREIGN PATENT DOCUMENTS

| | | |
|---|---|---|
| JP | 2006-261307 | 9/2006 |
| KR | 10-0155880 B1 | 7/1998 |

(Continued)

*Primary Examiner*—Charles D Garber
*Assistant Examiner*—Andre' C Stevenson
(74) *Attorney, Agent, or Firm*—Lee & Morse, P.C.

(57) ABSTRACT

A method of forming fine metal interconnect patterns includes forming an insulating film on a substrate, forming a plurality of mold patterns with first spaces therebetween on the insulating film, such that the mold patterns have a first layout, forming metal hardmask patterns in the first spaces by a damascene process, removing the mold patterns, etching the insulating film through the metal hardmask patterns to form insulating film patterns with second spaces therebetween, the second spaces having the first layout, and forming metal interconnect patterns having the first layout in the second spaces by the damascene process.

20 Claims, 7 Drawing Sheets

FOREIGN PATENT DOCUMENTS

| | | |
|---|---|---|
| KR | 1998-025458 | 7/1998 |
| KR | 10-0165399 B1 | 9/1998 |
| KR | 10-2003-0050172 | 6/2003 |
| KR | 10-2004-0055459 | 6/2004 |
| KR | 10-2006-0000678 A | 1/2006 |
| KR | 10-0574999 B1 | 4/2006 |
| KR | 10-2006-0110097 A | 10/2006 |
| KR | 10-0672123 B1 | 1/2007 |

* cited by examiner

METHOD OF FORMING FINE METAL PATTERNS FOR A SEMICONDUCTOR DEVICE USING A DAMASCENE PROCESS

BACKGROUND OF THE INVENTION

1. Field of the Invention

Embodiments of the present invention relate to a method of manufacturing a semiconductor device. More particularly, embodiments of the present invention relate to a method of forming fine metal semiconductor patterns with a reduced pitch therebetween using a damascene process.

2. Description of the Related Art

In general, manufacturing of highly integrated semiconductor devices may require formation of a large number of miniaturized elements, e.g., semiconductor patterns, and integration thereof within a small area. Conventional formation of semiconductor patterns, e.g., interconnect patterns, may be achieved via, e.g., photolithography and film patterning. For example, semiconductor patterns may be film patterned by etching a conductive film, e.g., a tungsten (W) film, via embossed hardmask patterns. Integration of the semiconductor patterns within a small area may require a reduced pitch therebetween, i.e., a reduced sum of a width of a single semiconductor pattern and a width of a single gap between adjacent semiconductor patterns.

However, reducing a pitch between adjacent semiconductor patterns may be limited when using photolithography due to resolution restrictions. Further, reducing a pitch between adjacent semiconductor patterns, e.g., interconnect patterns, when using, e.g., tungsten, film patterning may be limited due to generation of a resistance capacitance (RC) delay by a coupling capacitor. Accordingly, attempts have been made to form semiconductor patterns via patterning of copper (Cu) due to its low resistance, as compared to tungsten and/or aluminum, and relative stability to electro-migration (EM) and/or stress-migration (SM).

Despite the reliability imparted to a semiconductor devices having copper semiconductor patterns due to the low resistance thereof, formation of such semiconductor patterns may be complex because of poor etch characteristics of the copper. More specifically, formation of copper semiconductor patterns may require film patterning via a damascene process instead of direct etching through embossed masks. For example, negative patterns may be formed, e.g., with a silicate mask, in an insulating film, followed by filling of the negative patterns with copper.

However, formation of a plurality of negative patterns with a fine pitch therebetween, e.g., about several nanometers to about several tens of nanometers, in an insulating film by way of a damascene process may be complex even when double patterning is used. For example, a reduced pitch between adjacent negative patterns may provide uneven and/or inaccurate pattern profiles, and may potentially trigger a pattern collapse and/or electrical failures. Further, it may be difficult to form simultaneously negative patterns with varying dimensions, e.g., fine patterns for a cell array region and larger patterns for circuit elements in peripheral regions, in a single insulating film. Accordingly, there exists a need for a method of forming a plurality of fine semiconductor patterns with reduced pitch therebetween by way of a damascene process.

SUMMARY OF THE INVENTION

Embodiments of the present invention are therefore directed to a method of forming fine metal semiconductor patterns, which substantially overcomes one or more of the disadvantages of the related art.

It is therefore a feature of an embodiment of the present invention to provide a method of forming a plurality of fine metal semiconductor patterns with reduced pitch therebetween by way of a damascene process.

According to an aspect of the present invention, there is provided a method of forming fine metal interconnect patterns for a semiconductor device, including forming an insulating film on a substrate, forming a plurality of mold patterns with first spaces therebetween on the insulating film, such that the mold patterns have a first layout, forming metal hardmask patterns in the first spaces by a damascene process, removing the mold patterns, etching the insulating film through the metal hardmask patterns to form insulating film patterns with second spaces therebetween, the second spaces having the first layout, and forming metal interconnect patterns having the first layout in the second spaces by the damascene process.

Forming the mold patterns may include forming a plurality of first mold pattern portions and a plurality of second mold pattern portions in an alternating structure. Forming the mold patterns may include forming the pluralities of first mold pattern portions to have a first pitch, a pitch of the mold patterns being substantially equal to about one half of the first pitch. Forming the mold patterns may include forming the pluralities of the first and second mold pattern portions to have substantially equal heights and substantially equal distances therebetween.

The method of forming fine metal interconnect patterns for a semiconductor device may further include forming a first buffer layer with a substantially uniform thickness on outer surfaces of the first mold pattern portions to form trenches between the first mold pattern portions, such that the second mold pattern portions are formed in the trenches. Additionally, the method may include forming an etch stop layer and a second buffer layer between the insulation film and the plurality of first mold patterns. Forming the mold patterns may include disposing a polysilicon, an oxide, and/or a nitride on the insulating film.

Forming the metal hardmask patterns may include forming a first barrier film on surfaces of the first spaces and the mold patterns, and disposing a first metal film on the first barrier film to fill the first spaces. Disposing the first metal film may include disposing copper, tungsten, and/or aluminum. Disposing the first metal film may include forming a copper film by physical vapor deposition. Forming the copper film may include forming a first copper layer by physical vapor deposition and forming a second copper layer by electro-plating. Forming the metal hardmask patterns may further include removing the copper film and the first barrier layer to expose upper surfaces of the mold patterns. Removing the copper film and/or the first barrier layer may include chemical mechanical polishing, wet etching, and/or dry etching.

Forming the metal interconnect patterns may include forming a second barrier film on surfaces of the second spaces, and disposing a second metal film on the second barrier film to fill the second spaces. Forming the second barrier film may include using tantalum, tantalum nitride, titanium nitride, tantalum silicon nitride, titanium silicon nitride, or a combination thereof. Forming the second metal film may include performing physical vapor deposition and/or electro-plating. Forming the second metal film may include forming a copper interconnect layer in the second spaces.

Forming the copper interconnect layer may include forming a first copper layer on the second barrier film by physical vapor deposition, and forming a second copper layer on the first copper layer by electro-plating. Further, the method may include removing the copper interconnect layer, the second barrier film, and/or the metal hardmask to expose an upper surface of the insulating film. Forming the metal hardmask patterns and the metal interconnect patterns may include employing a substantially similar material.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
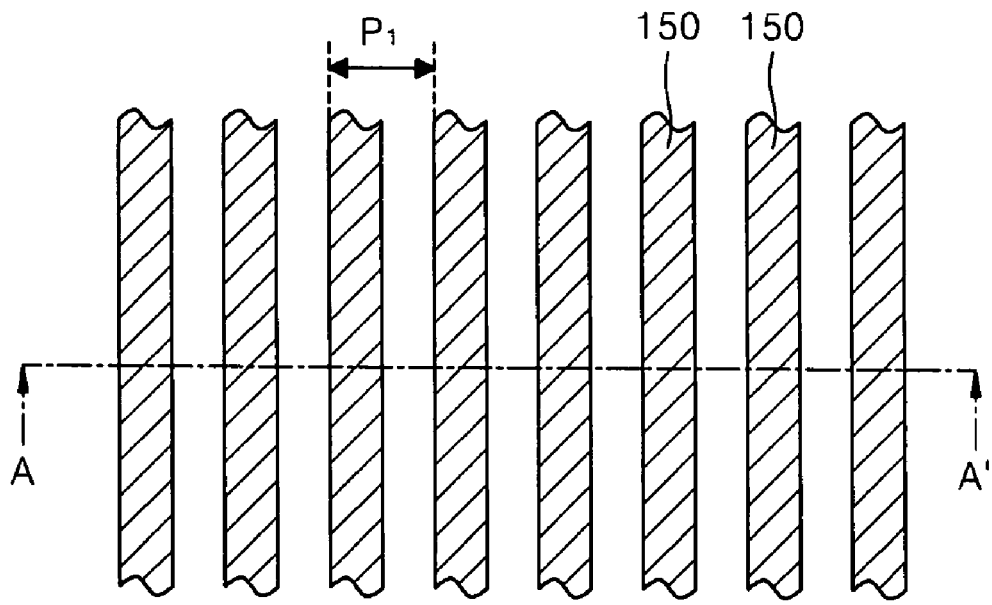
FIG. 1 illustrates a layout of a plurality of fine interconnect patterns for a semiconductor device formed according to an embodiment of the present invention.

Korean Patent Application No. 10-2007-0016797, filed on Feb. 16, 2007, in the Korean Intellectual Property Office, and entitled: "Method of Forming Final Metal Patterns for Semiconductor Device Using Damascene Process," is incorporated by reference herein in its entirety.

Embodiments of the present invention will now be described more fully with reference to the accompanying drawings, in which exemplary embodiments of the invention are illustrated. Aspects of the invention may, however, be embodied in different forms and should not be construed as being limited to the embodiments set forth herein. Rather, these embodiments are provided so that this disclosure will be thorough and complete, and will fully convey the concept of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An exemplary embodiment of a plurality of semiconductor patterns, e.g., interconnect patterns, formed according to the method of the present invention will now be described more fully with reference to FIG. 1. As illustrated in FIG. 1, a plurality of interconnect patterns 150, e.g., bit lines, may be configured in any suitable layout, e.g., a stripe-pattern with equal distances therebetween. The plurality of interconnect patterns 150 may be formed to have a first pitch P1, i.e., a sum of a width of a single interconnect pattern 150 and a width of a single gap between two adjacent interconnect patterns 150.

An exemplary embodiment of a method of forming the plurality of interconnect patterns 150 according to the present invention will now be described more fully with reference to FIGS. 2-15. It should be noted that FIGS. 2-15 correspond to a cross-sectional view along line A-A' of FIG. 1.

Figure 2:
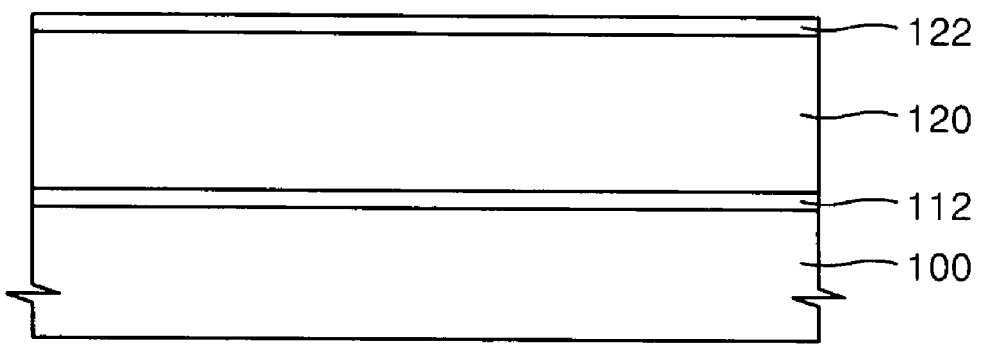
FIGS. 2-15 illustrate cross-sectional views of sequential steps during formation of a plurality of fine interconnect patterns for a semiconductor device according to an embodiment of the present invention.

As illustrated in FIG. 2, a first etch stop layer 112, an insulating film 120, and second etch stop layer 122 may be sequentially formed on a semiconductor substrate 100.

The first etch stop layer 112 may be deposited on the semiconductor substrate 100 to function as an etch stopper during etching of the insulating film 120. The first etch stop layer 112 may be formed of, e.g., silicon nitride, silicon oxide, silicon carbide, or combinations thereof, to a thickness of about 500 angstroms.

The insulating film 120 may be formed by disposing an intermetal insulating film on the first etch stop layer 112. The insulating film 120 may be formed of an insulating material having a relatively low dielectric constant in order to decrease an RC delay. For example, the insulating film 120 may be formed of tetraethyl orthosilicate (TEOS), fluorine silicate glass (FSG), silicon oxycarbide (SiOC), or silicon with a low-k (SiLK). The insulating film 120 may be etched to include patterns (not shown) corresponding to a layout of the interconnect patterns 150, as will be discussed in more detail below with respect to FIG. 12.

The second etch stop layer 122 may be formed by depositing, e.g., a polysilicon film, to a thickness of about 400 angstroms on the insulating film 120. The second etch stop layer 122 may function as an etch stopper when mold patterns are formed thereon, as will be discussed in more detail below with respect to FIGS. 3-8.

At least one unit element, e.g., a transistor (not shown), may be formed on the semiconductor substrate 100. Further, an interlayer insulating film (not shown) may be deposited on the semiconductor substrate 100 to cover the unit element. In addition, conductive regions (not shown) may be formed on the semiconductor substrate 100 to be electrically connected to the unit element through the interlayer insulating film. Upper surfaces of the conductive regions may be exposed.

Figure 3:
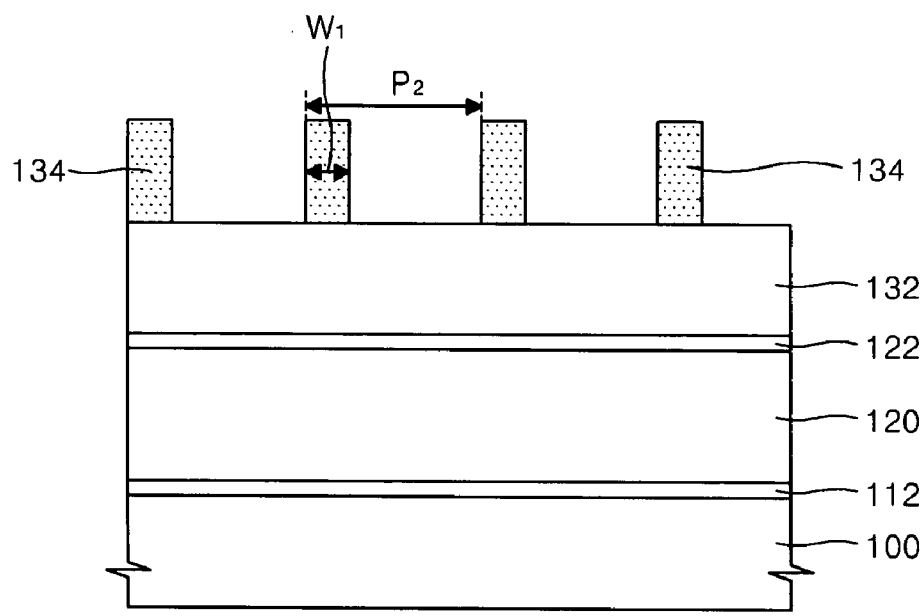

As illustrated in FIGS. 3-8, mold patterns 130 may be formed, e.g., by double patterning, on the semiconductor substrate 100 to correspond to a layout of the interconnect pattern 150. More specifically, as illustrated in FIG. 3, a first buffer layer 132 may be formed on the second etch stop layer 122. A first mold layer (not shown) may be deposited on the first buffer layer 132 to form a plurality of first mold pattern portions 134 via, e.g., photolithography or dry etching. The first mold pattern portions 134 may be formed to have a second pitch P2 between every two adjacent first mold pattern portions 134, and each first mold pattern portion 134 may have a first width W1. The first width W1 of the first mold pattern portions 134 may equal about ¼ of the second pitch P2.

The first buffer layer 132 and the first mold pattern portions 134 may be formed of different materials having different etch selectivities with respect to predetermined etch conditions. In other words, a material, e.g., oxide, nitride and/or polysilicon, for each of the first buffer layer 132 and the first mold pattern portions 134 may be selected, so that only one of the first buffer layer 132 and the first mold pattern portions 134 may be etched at a specific predetermined etching condition.

For example, the first buffer layer 132 may include at least one oxide film, e.g., a thermal oxide film, a chemical vapor deposition (CVD) oxide film, an undoped silicate glass (USG) oxide film, a high density plasma (HDP) oxide film, and so forth. When the first buffer layer 132 includes oxide, the first mold pattern portions 134 may be formed of, e.g., nitride or polysilicon. In another example, the first buffer layer 132 may be formed of at least one nitride film, e.g., silicon oxynitride (SiON), silicon nitride (SiN), silicon boron nitride (SiBN), and/or boron nitride (BN), so the first mold pattern portions 134 may be formed of, e.g., a silicon on glass (SOG) film or a flowable oxide (FoX) film. In yet another example, the first buffer layer 132 may be formed of a plurality of oxide and/or nitride films, so that the first mold pattern portions 134 may be formed of a polysilicon film.

Figure 4:
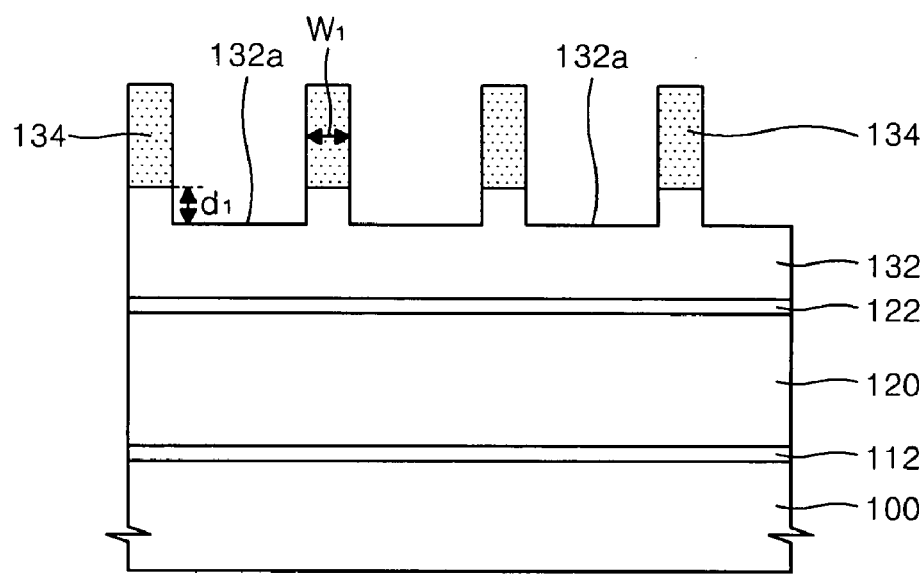

Next, as illustrated in FIG. 4, portions of the first buffer layer 132 may be removed to form low surface portions 132a. More specifically, portions of the first buffer layer 132 exposed between the plurality of first mold pattern portions 134 and having a first thickness d1 may be removed, i.e., the plurality of first mold pattern portions 134 may be used as an etch mask, via, e.g., dry etching. The first thickness d1, i.e., the thickness of the removed portions, may equal the first width W1 of the first mold pattern portions 134.

The first mold pattern portions 134 and the low surface portions 132a may be formed simultaneously. For example, if the first mold pattern portions 134 are formed by dry etching, the first mold layer and the first buffer layer 132 may be dry etched sequentially to remove completely overlapping portions of the mold pattern film and the first buffer layer 132 to form the first mold pattern portions 134 and the low surface portions 132a, respectively. Alternatively, the first mold pattern portions 134 and the low surface portions 132a may be formed via two separate dry etching processes. Accordingly, low surface portions 132a may be formed between the first mold pattern portions 134. Formation of the low surface portions 132a and/or the first buffer layer 132 may be omitted.

Figure 5:
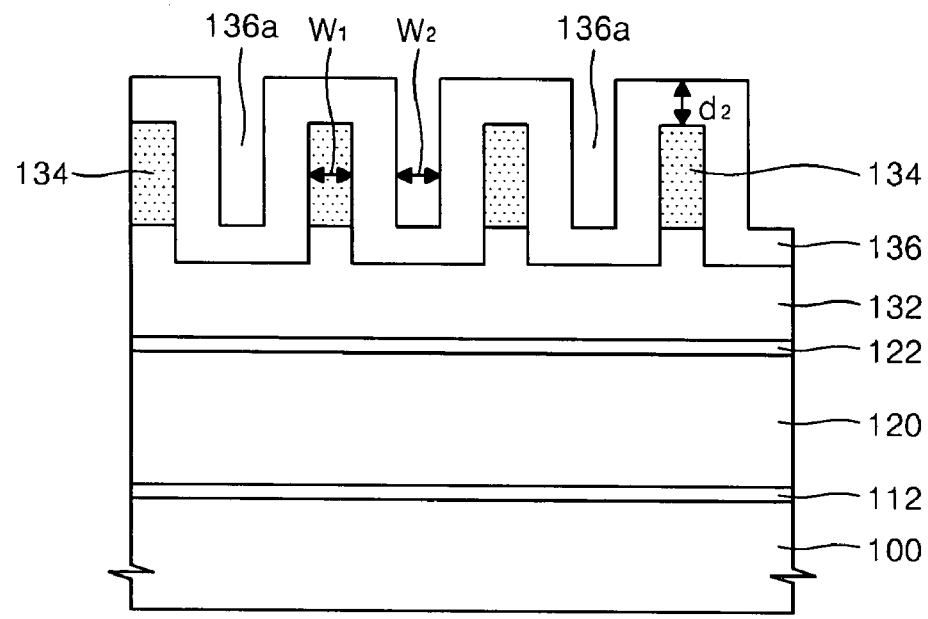

Next, as illustrated in FIG. 5, a second buffer layer 136 may be formed on the first buffer layer 132 to coat outer surfaces, i.e., sidewalls and/or upper surfaces, of the first mold pattern portions 134 and the low surface portions 132a. The second buffer layer 136 may be formed to have a second thickness d2, so that recess regions 136a having second widths W2, may be formed between adjacent first mold pattern portions 134 of the plurality of the first mold pattern portions 134. More specifically, each recess region 136a may be defined between outer surfaces of two adjacent vertical portions of the second buffer layer 136, i.e., portions of the second buffer layer 136 coated on sidewall surfaces of adjacent and facing first mold pattern portions 134. The second thickness d2 of the second buffer layer 136 may be substantially uniform, and may be adjusted, so the second width W2 of each recess region 136a may substantially equal the first width W1. The second thickness d2 may substantially equal the first thickness d1.

The second buffer layer 136 may be formed of a material having an etch selectively that is substantially similar to the etch selectivity of the first buffer layer 132. For example, the first and second buffer layers 132 and 136 may be formed of the same material. In another example, the second buffer layer 136 may be an oxide film, e.g., an oxide film formed by atomic layer deposition (ALD), and the first buffer layer 132 may be formed of a different material having a substantially similar etch selectivity with respect to the oxide film.

Figure 6:
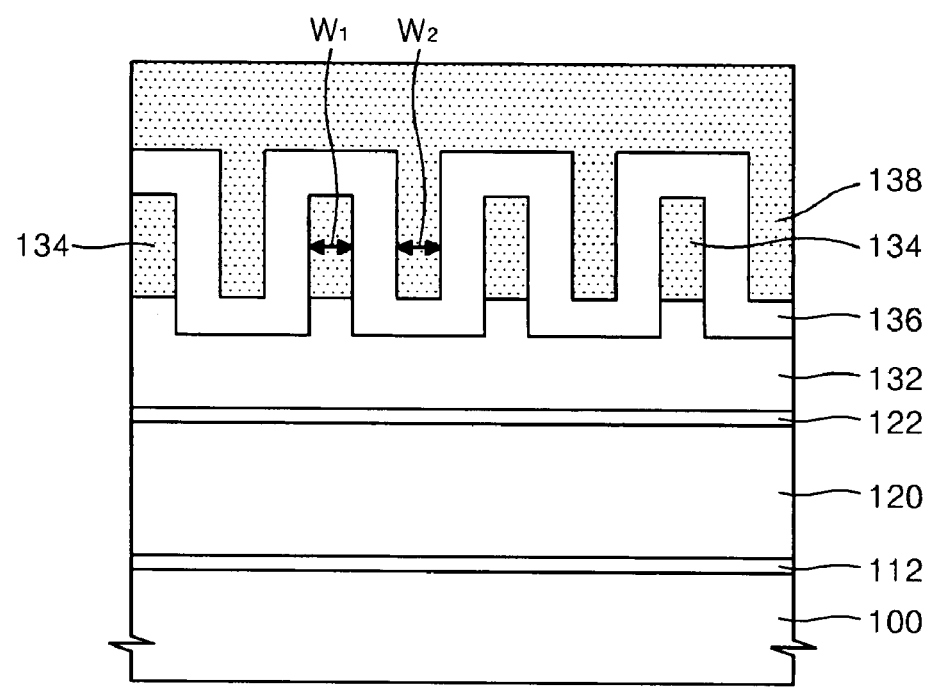

Once the second buffer layer 136 is formed, a second mold layer 138 may be formed on the second buffer layer 136, as illustrated in FIG. 6. More specifically, the second mold layer 138 may be deposited on an outer surface of the second buffer layer 136, so that recess regions 136a may be filled therewith. Accordingly, portions of the second mold layer 138 formed in the recess regions 136a may have the second width W2. The second mold layer 138 may be formed of a material having a substantially similar etch selectivity with respect to the first mold pattern portions 134. For example, if the first and second buffer layers 132 and 136 are oxide films, the second mold layer 138 may be a polysilicon film.

Figure 7:
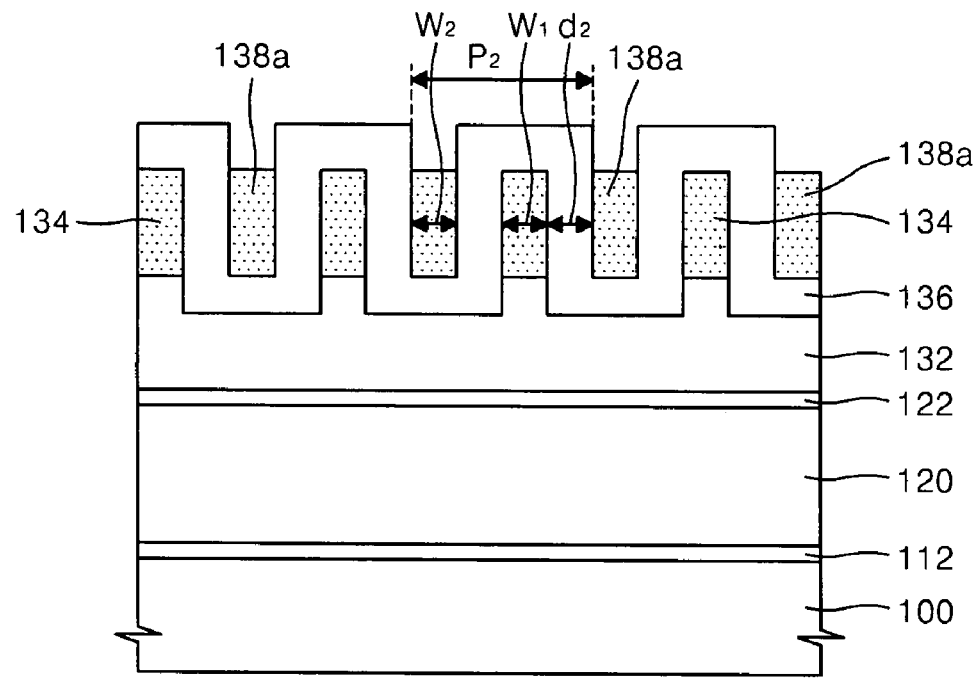

Next, as illustrated in FIG. 7, an upper portion of the second mold layer 138 may be removed, so that an upper surface, i.e., a surface facing away from the semiconductor substrate 100, of the first buffer layer 136 may be exposed. Further, portions of the second mold layer 138 may be removed to form a plurality of second mold pattern portions 138a in the recess regions 136a. In other words, the second mold pattern portions 138a may be formed in the recess regions 136a between adjacent first mold pattern portions 134, and may have the second width W2. Accordingly, the second mold pattern portions 138a may be spaced at the second pitch P2 from one another, and may be positioned in an alternating pattern with the first mold pattern portions 134, as further illustrated in FIG. 7. The first and second mold pattern portions 134 and 138a may be separated from one another by the second buffer layer 136.

The second mold pattern portions 138a may have a predetermined height. More specifically, when the upper portion of the second mold layer 138 is removed, e.g., by wet etching, to form the second mold patterns 138a, a size of the removed portion may be adjusted to align upper surfaces of the first and second mold pattern portions 134 and 138a. In other words, the first and second mold pattern portions 134 and 138a may form an alternating line pattern extending in a same direction to a substantially same height, i.e., upper surfaces of the first and second mold pattern portions 134 and 138a may reach a substantially same horizontal plane with respect to the semiconductor substrate 100. As such, if low surface portions 132a are formed, the first and second mold pattern portions 134 and 138a may have a substantially same vertical length, i.e., formed on a substantially same horizontal plane and extend to the same height.

Figure 8:
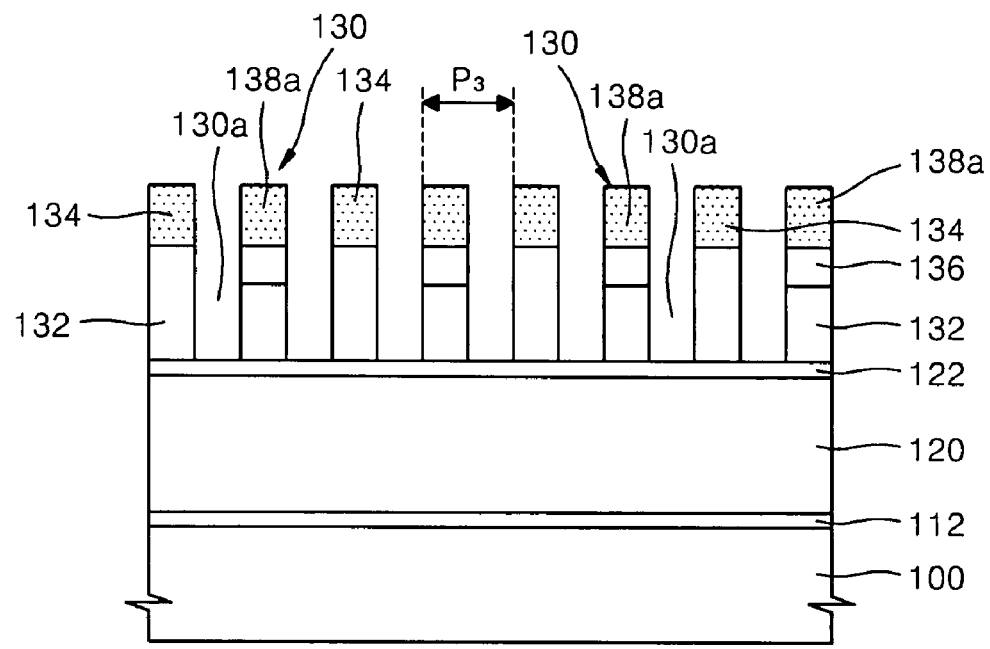

Subsequently, as illustrated in FIG. 8, the first and second buffer layers 132 and 136 may be, e.g., anisotropically dry etched, using the first and second mold pattern portions 134 and 138a as an etch mask. More specifically, portions of the first and second buffer layers 132 and 136, i.e., portions not forming completely overlapping regions directly under either the first mold pattern portions 134 or directly under the second mold pattern portions 138a, may be removed to form a plurality of mold patterns 130 and first spaces 130a on the second etch stop layer 122, as further illustrated in FIG. 8.

The plurality of mold patterns 130 may include the alternating first and second mold pattern portions 134 and 138a, e.g., a first mold pattern portion 134 may be positioned between two second mold pattern portions 138a. The first and second mold pattern portions 134 and 138a may be positioned to have substantially similar distances therebetween to form the first spaces 130a. If formation of the first buffer layer 132 is omitted, as described previously with respect to FIG. 3, the mold patterns 130 may include only combinations of the first mold pattern portions 134, second buffer layer 136, and/or the second mold pattern portions 138a, i.e., no portions of the first buffer layer 132. Accordingly, height of the mold patterns 130 may be non-uniform, e.g., the first and second mold pattern portions 134 and 138a may have different vertical lengths despite alignment of upper surfaces thereof.

The anisotropic dry etching of the first and second buffer layers 132 and 136 may expose an upper surface of the etch stop layer 122 through the first spaces 130a. The etch stop layer 122 may function as an etch stopper, so that the mold patterns 130 may be formed to have uniform and accurate sidewall profiles. In other words, substantial deviation in terms of positioning or dimensions of the mold patterns 130 may be minimized or eliminated, thereby substantially reducing pattern collapse. Portions of the second etch stop layer 122, i.e., portions exposed between the plurality of mold patterns 130, may be removed by etching to expose the first insulating film 120 through the first spaces 130a (not shown).

The first and second mold pattern portions 134 and 138a may be partially etched as well in order to adjust a width thereof, i.e., so the mold patterns 130 may have a third pitch P3. In this respect, it is noted that since the first and second widths W1 and W2 are formed to be substantially similar, and the second thickness d2 of the second buffer layer 136 is formed to be substantially uniform, each of the first width W1, second width W2, and second thickness d2 may substantially equal about ¼ of the second pitch P2. In other words, as illustrated in FIG. 7, if the second pitch P2 substantially equals a sum of the first and second widths W1 and W2 and two second thicknesses d2, and each of the first and second widths W1 and W2 equals about ¼ of the second pitch P2, the second thickness d2 may equal about ¼ of the second pitch P2. Accordingly, the third pitch P3 may equal about ½ of the second pitch P2.

Formation of the first mold pattern portions 134, second mold pattern portions 138a, and second buffer layer 136 may be adjusted, so that the third pitch P3 may substantially equal a desired pitch, i.e., the first pitch P1 of the interconnect patterns 150 illustrated in FIG. 1. As such, the plurality of mold patterns 130 may have a substantially similar layout to that of the interconnect patterns 150. In this respect, it should be noted that a layout of patterns and/or spaces as used herein refers to a spatial geometric configuration in terms of, e.g., positioning, number, and so forth. Accordingly, patterns and/or spaces having "substantially similar layouts" and/or "corresponding layouts" may be positioned to completely overlap with one another.

Figure 9:
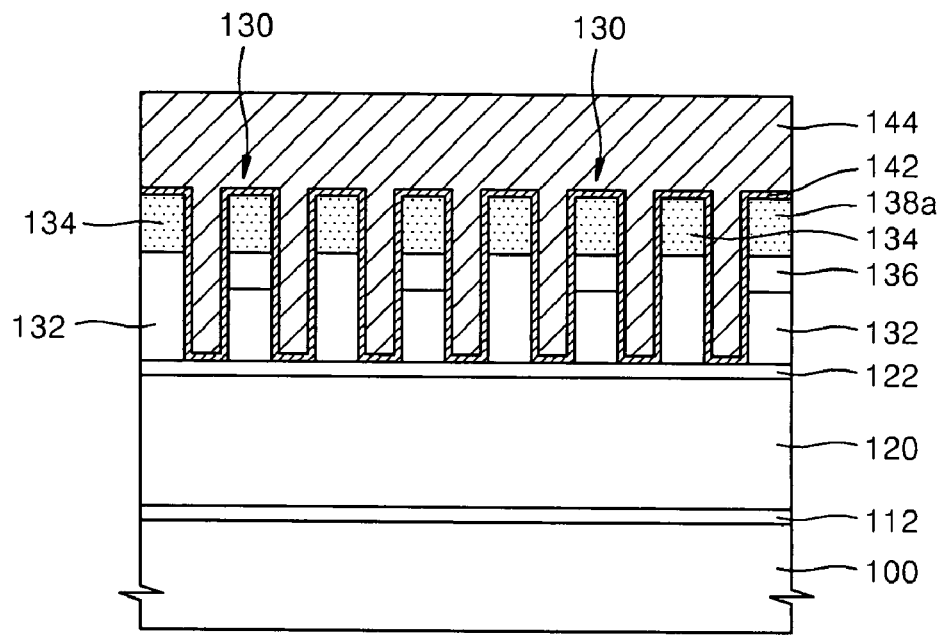
Figure 10:
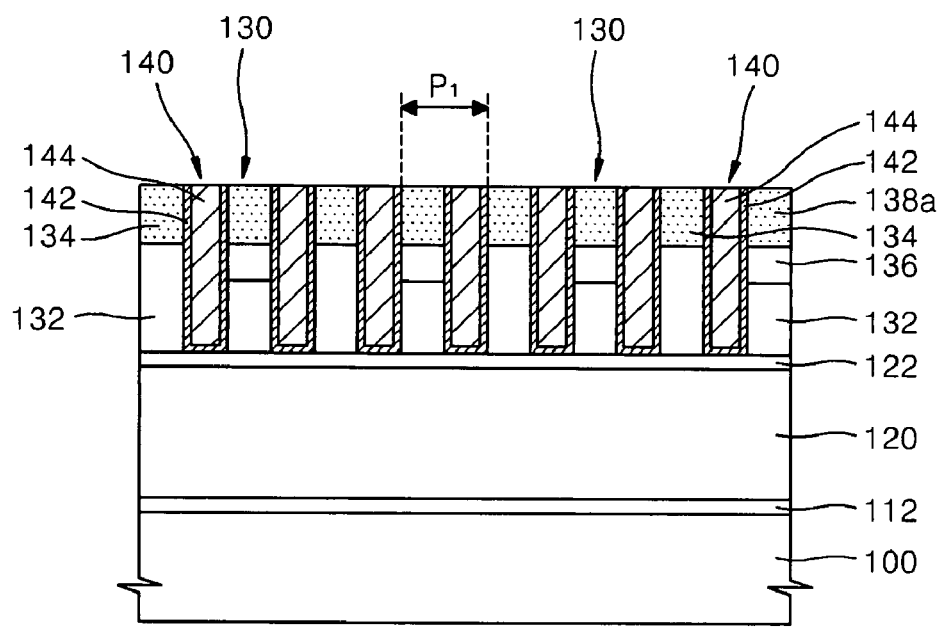

Once the mold patterns 130 are formed, metal hardmask patterns 140 may be formed, as illustrated in FIGS. 9-10. First, as illustrated in FIG. 9, a first barrier film 142 may be disposed on surfaces of the first spaces 130a and on surfaces of the mold patterns 130. Next, as further illustrated in FIG. 9, a first metal film 144 may be formed on the first barrier film 142 to fill the first spaces 130a.

The first barrier film 142 may have a predetermined thickness with respect to a width and a depth of the first spaces 130a, e.g., a thickness of about several angstroms to about several tens of angstroms. For example, the first barrier film 142 may have a thickness of about 5 angstroms to about 150 angstroms. The first barrier film 142 may be formed of, e.g., tantalum (Ta), tantalum nitride (TaN), titanium nitride (TiN), tantalum silicon nitride (TaSiN), titanium silicon nitride (TiSiN) or a combination thereof, by, e.g., CVD or sputtering. Formation of the first barrier film 142 may minimize or prevent diffusion of metal atoms of the first metal film 144 into the mold patterns 130. However, formation of the first barrier film 142 may be omitted.

The first metal film 144 may be formed of metal, e.g., copper (Cu), tungsten (W), aluminum (Al), and so forth, by, e.g., physical vapor deposition (PVD) and/or electro-plating. For example, if the first metal film 144 is formed of copper, a first copper film may be formed on the first barrier film 142 by PVD, followed by copper electro-plating using the first copper film as a seed layer to form a second copper film. If the first metal film 144 includes a double film structure, e.g., first and second copper films, the first film may provide an initial nuclear forming position to improve uniformity of the second film formed thereon by subsequent electro-plating. The first film, e.g., the first copper film, may have a thickness of, e.g., about 100 angstroms to about 500 angstroms. The second film, e.g., the second copper film, may be formed to a sufficient thickness to fill the first spaces 130a. For example, the second film may have a thickness of about 1,000 angstroms to about 10,000 angstroms.

Next, as illustrated in FIG. 10, the first metal film 144 and the first barrier film 142 may be partially removed to expose upper surfaces of the mold patterns 130, thereby forming metal hardmask patterns 140 in the first spaces 130a, i.e., between the plurality of mold patterns 130. Accordingly, the metal hardmask patterns 140 may be formed to have the first pitch P1. Removal of portions of the first metal film 144 and first barrier film 142 may be performed via, e.g., chemical mechanical polishing, wet etching, and/or dry etching.

For example, a portion of the first metal film 144 may be wet etched to expose the first barrier film 142, and a portion of the first barrier film 142 may be dry etched. If the first metal film 144 is formed of copper, wet etching thereof may be performed, e.g., by using an etchant including a mixture of, e.g., hydrogen fluoride (HF), hydrogen peroxide ($H_2O_2$), and water ($H_2O$) at volumetric ratios of about 1:1:50 to about 5:5:300, respectively. In another example, an etchant including a mixture of sulfuric acid ($H_2SO_4$) and hydrogen peroxide ($H_2O_2$) at a volumetric ratio of about 2:1 to about 10:1 may be used. If the first barrier film 142 is formed of tantalum (Ta), tantalum nitride (TaN), or a combination thereof, an etchant including a mixture of ammonia ($NH_3$), hydrogen peroxide ($H_2O_2$), and water ($H_2O$) at a volumetric ratio of about 1:1:5 to about 5:5:30, respectively, may be used to perform wet etching. Alternatively, if the first barrier film 142 is formed of tantalum (Ta), tantalum nitride (TaN), or a combination thereof, a plasma method using chloride ($Cl_2$) and boron trichloride ($BCl_3$) as an etchant may be used to perform dry etching. The first metal film 144 and the first barrier film 142 may be wet etched at a normal temperature.

Figure 11:
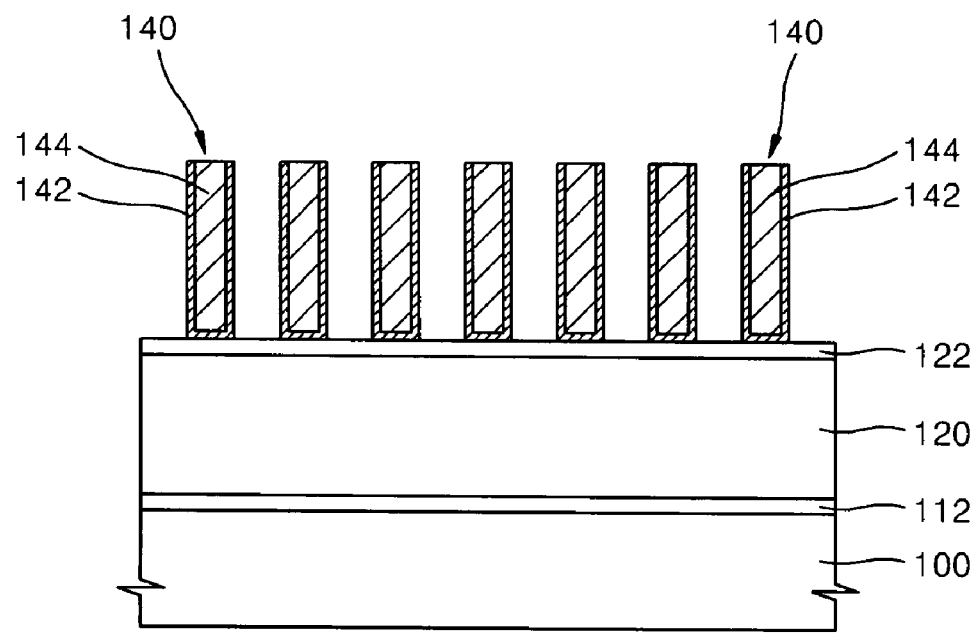
Figure 12:
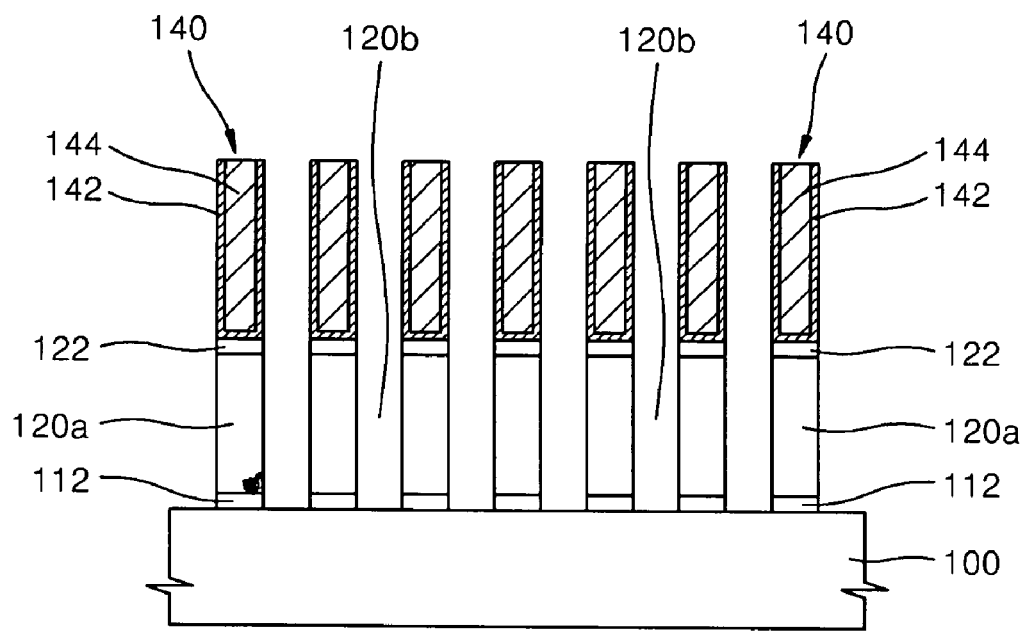

Subsequently, as illustrated in FIG. 11, the mold patterns 130 may be removed via, e.g., dry etching, using the metal hardmask patterns 140 as an etch mask. Once the mold patterns 130 are removed, the metal hardmask patterns 140 may remain on the semiconductor substrate 100 with spaces therebetween, so that the upper surface of the etch stop layer 122 may be exposed therethrough. Next, the metal hardmask patterns 140 may be used as an etch mask to etch, e.g., by anisotropic dry etching, the first etch stop layer 112, the second etch stop layer 122, and the insulating film 120 to form insulating film patterns 120a, as illustrated in FIG. 12. The insulating film patterns 120a may be positioned directly under the metal hardmask patterns 140, and may substantially completely overlap therewith because of substantially equal widths of the insulating film patterns 120a and the metal hardmask patterns 140.

Etching of the first etch stop layer 112, the second etch stop layer 122, and the insulating film 120 may expose an upper surface of the semiconductor substrate 100, and may form second spaces 120b between the insulating film patterns 120a. Dry etching of the first etch stop layer 112 may expose through the second spaces 120b the conductive region (not shown) or the interlayer insulating film (not shown) of the semiconductor substrate 100. The second spaces 120b may correspond, e.g., in terms of layout, to the interconnect patterns 150 of FIG. 1, and may be referred to as "negative patterns."

Using the metal hardmask patterns 140 to etch the insulating film 120 may be advantageous in improving etch selectivity of the insulating film 120 as compared to a conventional etching mask formed of a non-metal material. More specifically, forming the metal hardmask patterns 140 of copper may increase etch selectivity of the insulating film 120 due to etch resistivity of the copper, thereby substantially minimizing and/or preventing copper consumption during etching. Further, forming the metal hardmask patterns 140 of copper may increase etch selectivity with respect to a large number of potential materials used to form the insulating film 120, even when the metal hardmask patterns 140 is relatively thin. Therefore, the metal hardmask patterns 140 may be used as an etch mask to form the second spaces 120b to a relatively large depth, i.e., through a relatively thick insulating film 120, or to have a relatively large aspect ratio, thereby substantially minimizing and/or preventing damage to sidewall profiles of the insulating film patterns 120a.

Figure 13:
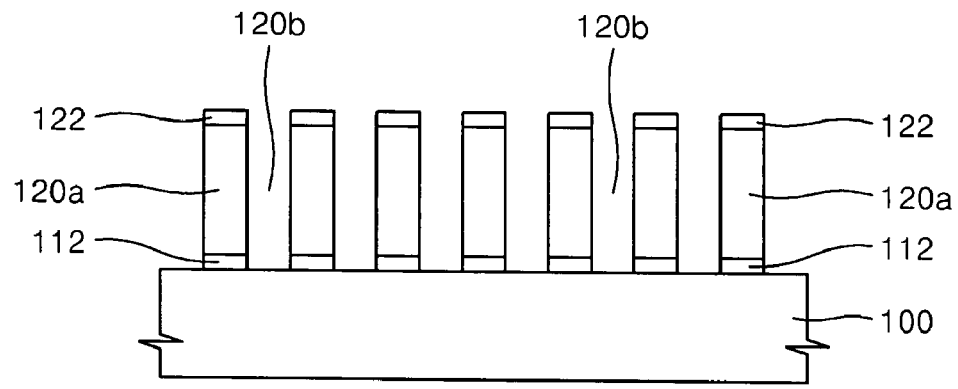

Once the second spaces 120b are formed, the metal hardmask patterns 140 may be removed, as illustrated in FIG. 13, by, e.g., wet etching. If wet etching is used to remove the metal hardmask patterns 140, details thereof may be substantially similar to the wet etching described previously with respect to removal of the first metal film 144 and the first barrier film 142 in FIG. 10, and therefore, will not be repeated herein. On the other hand, the metal interconnect patterns 150 may be formed according to an embodiment of the present invention without removing the metal hardmask patterns 140 at this point.

Figure 14:
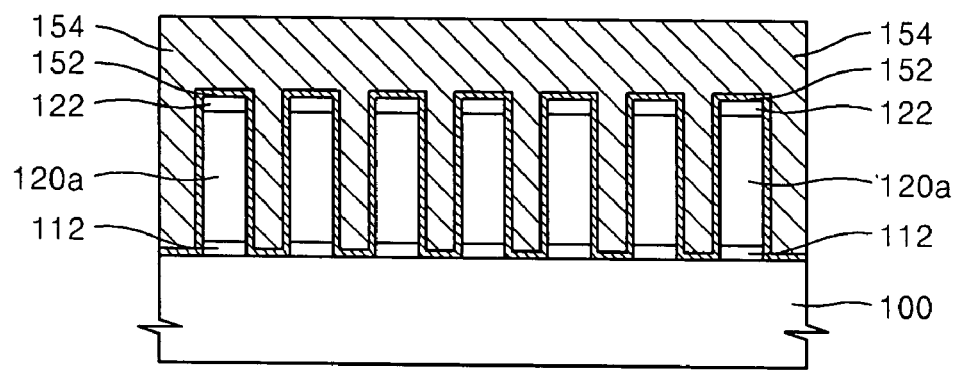
Figure 15:
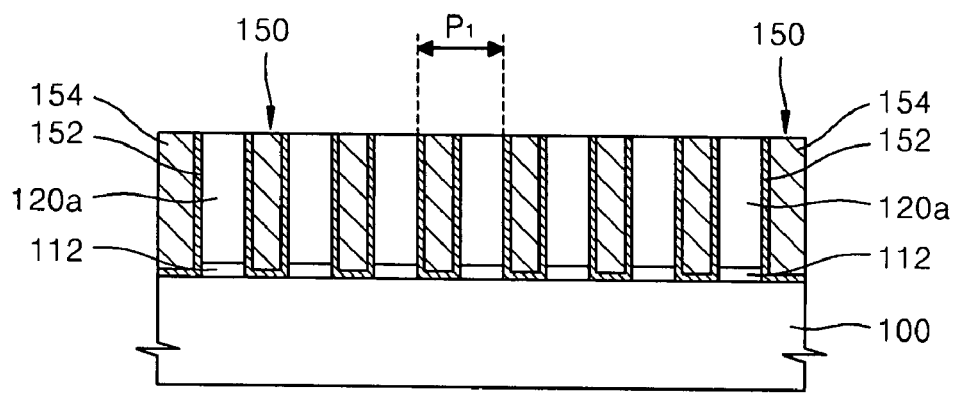

Finally, as illustrated in FIGS. 14-15, metal interconnect patterns 150 may be formed in the second spaces 120b using a damascene process. More specifically, as illustrated in FIG. 14, a second barrier film 152 may be formed on sidewalls of the second spaces 120b, followed by formation of a second metal film 154 on the second barrier film 152 to fill the second spaces 120b. The second metal film 154 and the second barrier film 152 may be partially removed to finalize formation of the metal interconnect patterns 150, as illustrated in FIG. 15.

The second barrier film 152 may minimize or prevent diffusion of metal atoms of the second metal film 154 into, e.g., the insulating film patterns 120a. The second barrier film 152 may be formed to a thickness of about several angstroms to about several tens of angstroms, as determined with respect to a width and a depth of the second spaces 120b. The second metal film 154 may be formed of metal, e.g., copper (Cu), tungsten (W), aluminum (Al), and so forth. Formation of the second metal film 154 of copper may be particularly advantageous due to a relatively low resistivity thereof, thereby minimizing or eliminating the RC delay and providing overall increased electrical stability to the metal interconnect patterns 150.

Formation of the second barrier film 152 and the second metal film 154 may be substantially similar to the formation of the first barrier film 142 and the first metal film 144, respectively, described previously with reference to FIG. 9, and therefore, their detailed description will not be repeated herein. It should be noted, however, that if the metal hardmask patterns 140 are not removed once the second spaces 120b are formed, the second barrier film 152 may be formed on surfaces of the metal hardmask patterns 140 as well as on surfaces of the second spaces 120b.

The metal interconnect patterns 150 may be formed in the second spaces 120b, i.e., between the insulating film patterns 120a, and may include portions of the second barrier film 152 and portions of the second metal film 154. Partial removal of the second metal film 154 and of the second barrier film 152 may be substantially similar to the removal of portions of the first metal film 144 and portions of the first barrier film 142, respectively, described previously with reference to FIG. 10. Accordingly, a detailed description of the partial removal of the first metal film 144 and of the first barrier film 142 will not be repeated herein. The interconnect patterns 150 may be formed of a substantially similar material as the hardmask patterns 140. More particularly, the second metal film 154 of the interconnect patterns 150 may be formed of a substantially similar material as the first metal film 144 of the metal hardmask patterns 140. In this respect, it should be noted that even if the metal hardmask patterns 140 have not been removed during the procedure described with reference to FIG. 13, the metal hardmask patterns 140 may be removed while removing portions of the second metal film 154 and of the second barrier film 152.

A method of forming fine interconnect patterns for a semiconductor device according to embodiments of the present invention, may be advantageous in facilitating repeated formation of a plurality of fine metal interconnect patterns with a reduced pitch therebetween via a damascene process. In particular, embodiments of the present invention may provide formation of negative patterns, corresponding to a desired predetermined layout of interconnect patterns, in an insulating material by using a metal pattern mask. Accordingly, metal interconnect patterns may be formed directly in the negative patterns of the insulating material by a damascene process, thereby eliminating a need for a separate and/or a new layout design for forming the negative patterns. Consequently, even when the interconnect patterns are formed by the damascene process to have a reduced pitch therebetween, different patterns, dimensions, and/or pitches may be formed simultaneously.

Furthermore, embodiments of the method according to the present invention may provide for a metal hardmask configured to form the insulating film patterns and increase etch selectivity thereof, thereby facilitating formation of metal hardmask with a reduced thickness, as compared to non-metal hardmasks, e.g., embossed mask. In addition, embodiments of the method according to the present invention may provide formation of spaces with a large aspect ratio, thereby facilitating formation of insulating patterns with improved sidewall profiles. Also, embodiments of the method according to the present invention may provide formation of a plurality of copper interconnect patterns with a reduced pitch therebetween, thereby substantially minimizing or eliminating RC delay in ultrahigh integrated semiconductor devices. Accordingly, embodiments of the method according to the present invention may increase overall electrical stability and reliability of the ultra-high integrated semiconductor devices.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming fine metal interconnect patterns, comprising:
   forming an insulating film on a substrate;
   forming a plurality of mold patterns with first spaces therebetween on the insulating film, such that the mold patterns have a first layout;
   forming metal hardmask patterns in the first spaces by a damascene process;
   removing the mold patterns;
   etching the insulating film using the metal hardmask patterns as an etch mask to form insulating film patterns with second spaces therebetween, the second spaces having the first layout; and
   forming metal interconnect patterns having the first layout in the second spaces by the damascene process,
   wherein forming the mold patterns includes forming a plurality of first mold pattern portions and a plurality of second mold pattern portions in an alternating structure.

2. The method as claimed in claim 1, wherein forming the mold patterns includes forming the pluralities of first mold pattern portions to have a first pitch, a pitch of the mold patterns being substantially equal to about one half of the first pitch.

3. The method as claimed in claim 1, wherein the pluralities of the first and second mold pattern portions have substantially equal heights and substantially equal distances therebetween.

4. The method as claimed in claim 1, further comprising forming a first buffer layer with a substantially uniform thickness on outer surfaces of the first mold pattern portions to form trenches between the first mold pattern portions, such that the second mold pattern portions are formed in the trenches.

5. The method as claimed in claim 4, further comprising forming an etch stop layer and a second buffer layer between the insulation film and the plurality of first mold pattern portions.

6. The method as claimed in claim 1, wherein forming the mold patterns includes disposing a polysilicon, an oxide, and/or a nitride on the insulating film.

7. The method as claimed in claim 1, wherein forming the metal hardmask patterns includes forming a first barrier film on surfaces of the first spaces and the mold patterns, and disposing a first metal film on the first barrier film to fill the first spaces.

8. The method as claimed in claim 7, wherein disposing the first metal film includes disposing copper, tungsten, and/or aluminum.

9. The method as claimed in claim 7, wherein disposing the first metal film includes forming a copper film by physical vapor deposition.

10. The method as claimed in claim 9, wherein forming the copper film includes forming a first copper layer by physical vapor deposition and forming a second copper layer by electro-plating.

11. The method as claimed in claim 9, wherein forming the metal hardmask patterns further comprises removing the copper film and the first barrier layer to expose upper surfaces of the mold patterns.

12. The method as claimed in claim 11, wherein removing the copper film and/or the first barrier layer includes chemical mechanical polishing, wet etching, and/or dry etching.

13. The method as claimed in claim 1, wherein forming the metal interconnect patterns includes forming a second barrier film on surfaces of the second spaces, and disposing a second metal film on the second barrier film to fill the second spaces.

14. The method as claimed in claim 13, wherein forming the second barrier film includes using tantalum, tantalum nitride, titanium nitride, tantalum silicon nitride, titanium silicon nitride, or a combination thereof.

15. The method as claimed in claim 13, wherein forming the second metal film includes performing physical vapor deposition and/or electro-plating.

16. The method as claimed in claim 13, wherein forming the second metal film includes forming a copper interconnect layer in the second spaces.

17. The method as claimed in claim 16, wherein forming the copper interconnect layer includes forming a first copper layer on the second barrier film by physical vapor deposition, and forming a second copper layer on the first copper layer by electro-plating.

18. The method as claimed in claim 17, further comprising removing the copper interconnect layer, the second barrier film, and/or the metal hardmask to expose an upper surface of the insulating film.

19. The method as claimed in claim 1, wherein forming the metal hardmask patterns and the metal interconnect patterns includes employing a substantially similar material.

20. The method as claimed in claim 1, wherein forming the plurality of first and second mold pattern portions in an alternating structure includes forming each second mold pattern portion between two adjacent first mold pattern portions, the second mold pattern portion being separated via a space from each of the two adjacent first mold pattern portions.

* * * * *